United States Patent [19]

Shimamura et al.

[11] Patent Number: 4,622,640
[45] Date of Patent: Nov. 11, 1986

[54] POWER LOAD SURVEY APPARATUS

[75] Inventors: Yukio Shimamura, Chigasaki; Yoshihiro Tsukuda; Ikuo Maeda, both of Yokohama, all of Japan

[73] Assignee: Tokyo Shibaura Denki Kabushiki Kaisha, Kawasaki, Japan

[21] Appl. No.: 517,051

[22] Filed: Jul. 25, 1983

[30] Foreign Application Priority Data

Jul. 29, 1982 [JP] Japan ................. 57-132438

[51] Int. Cl.[4] .......................................... G01R 21/00
[52] U.S. Cl. ................... 364/483; 324/113; 364/464; 360/6
[58] Field of Search .......... 364/483, 464, 200, 900; 360/6; 324/113, 74; 235/380, 492

[56] References Cited

U.S. PATENT DOCUMENTS

| 4,216,527 | 8/1980 | Emerson et al. ............ 364/483 |
| 4,218,737 | 8/1980 | Buscher et al. ............ 364/483 X |
| 4,236,217 | 11/1980 | Kennedy ............... 364/900 X |
| 4,258,430 | 3/1981 | Tyburski ............... 364/900 |
| 4,355,361 | 10/1982 | Riggs ............... 324/103 R X |
| 4,360,879 | 11/1982 | Cameron ............... 364/483 |
| 4,361,877 | 11/1982 | Dyer et al. ............... 364/900 |
| 4,388,611 | 6/1983 | Haferd ............... 364/483 X |
| 4,399,510 | 8/1983 | Hicks ............... 364/483 X |
| 4,400,783 | 8/1983 | Locke, Jr. et al. ............ 364/900 X |
| 4,433,387 | 2/1984 | Dyer et al. ............... 364/900 |
| 4,498,000 | 2/1985 | Decavele et al. ............ 235/492 X |
| 4,528,503 | 7/1985 | Cole ............... 324/158 R X |

Primary Examiner—Errol A. Krass
Assistant Examiner—Joseph L. Dixon
Attorney, Agent, or Firm—Cushman, Darby & Cushman

[57] ABSTRACT

A power load survey apparatus is disclosed with an electronic power sensor for detecting a power load in the form of a pulse signal, a collector cartridge detachably coupled to the electronic power sensor and having a memory for storing the pulse signal and the time of data collection. The time is obtained from a self-contained time keeping circuit. A memory and magnetic tape converting device is detachably coupled to the collector cartridge and includes a magnetic tape device for transferring and recording data from the memory of the electronic power sensor, and a standard clock 52. The time data obtained from the collector cartridge is time rectified to a standard time from the standard clock 52 each time the collector cartridge is coupled to the memory/magnetic tape converting device thereby insuring that the collector cartridge shows a correct time.

5 Claims, 12 Drawing Figures

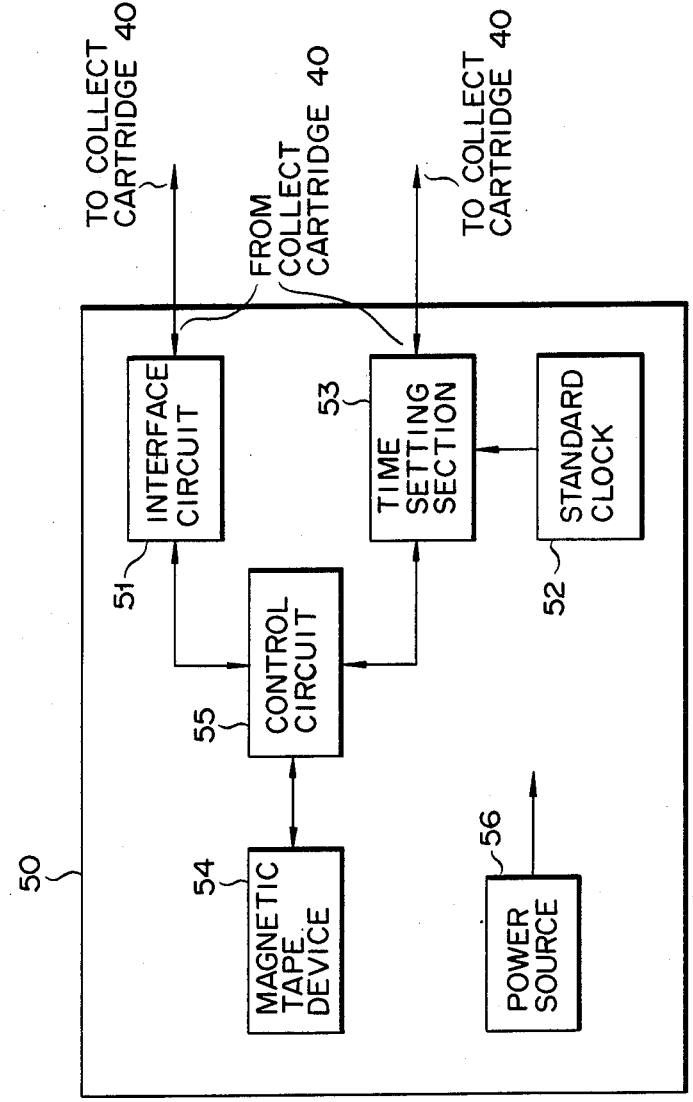

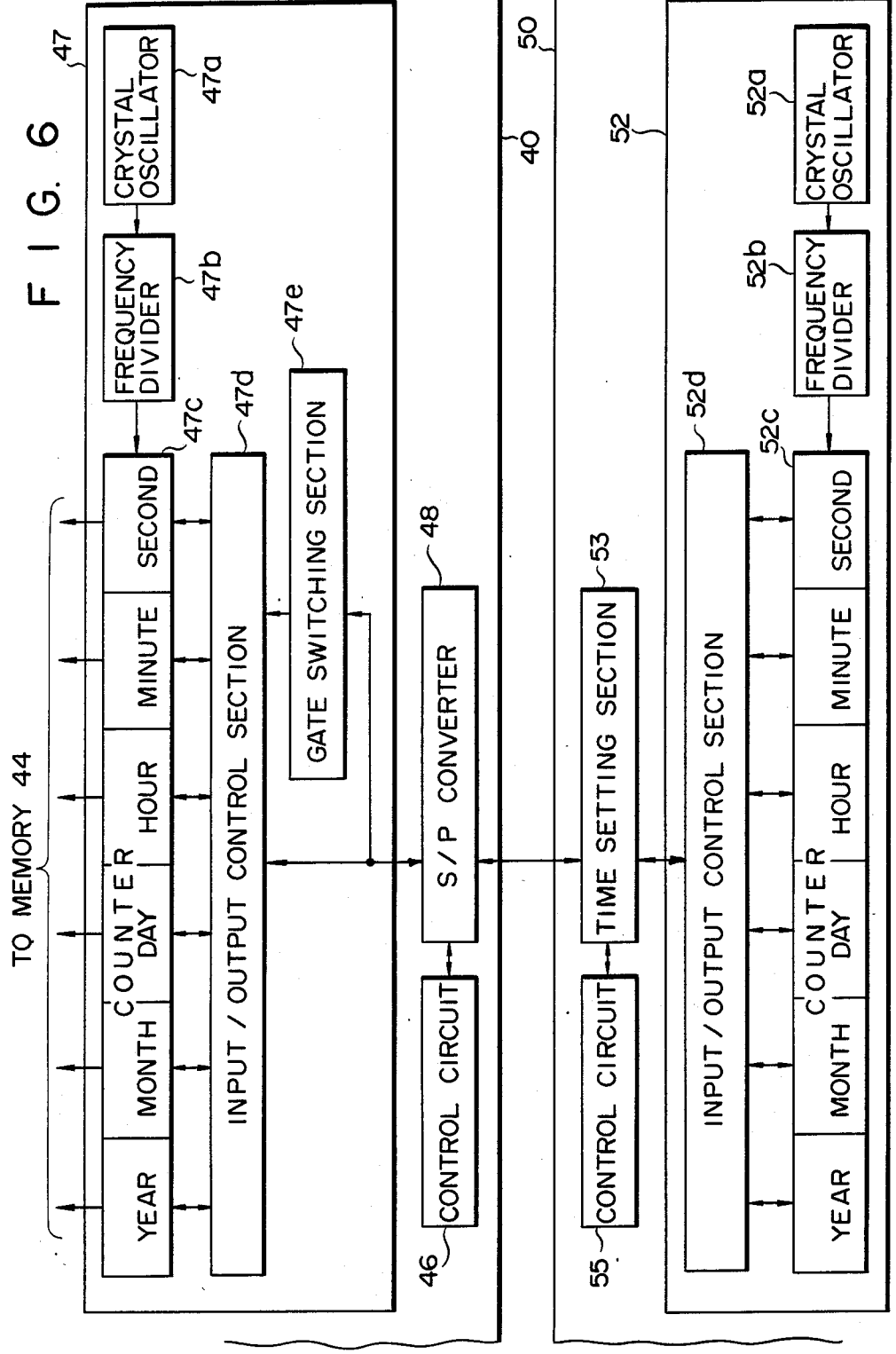

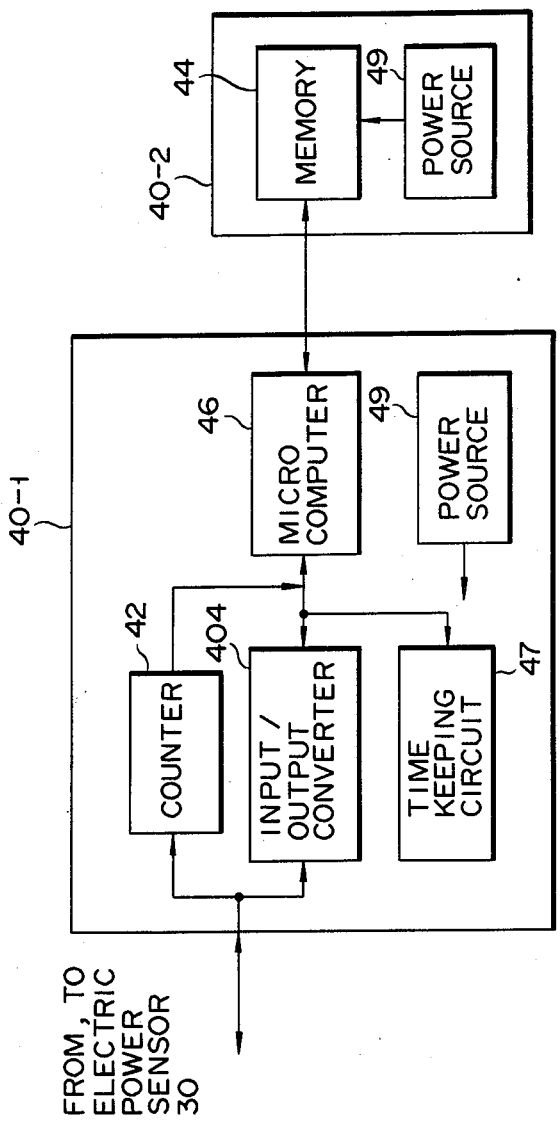
F I G. 8

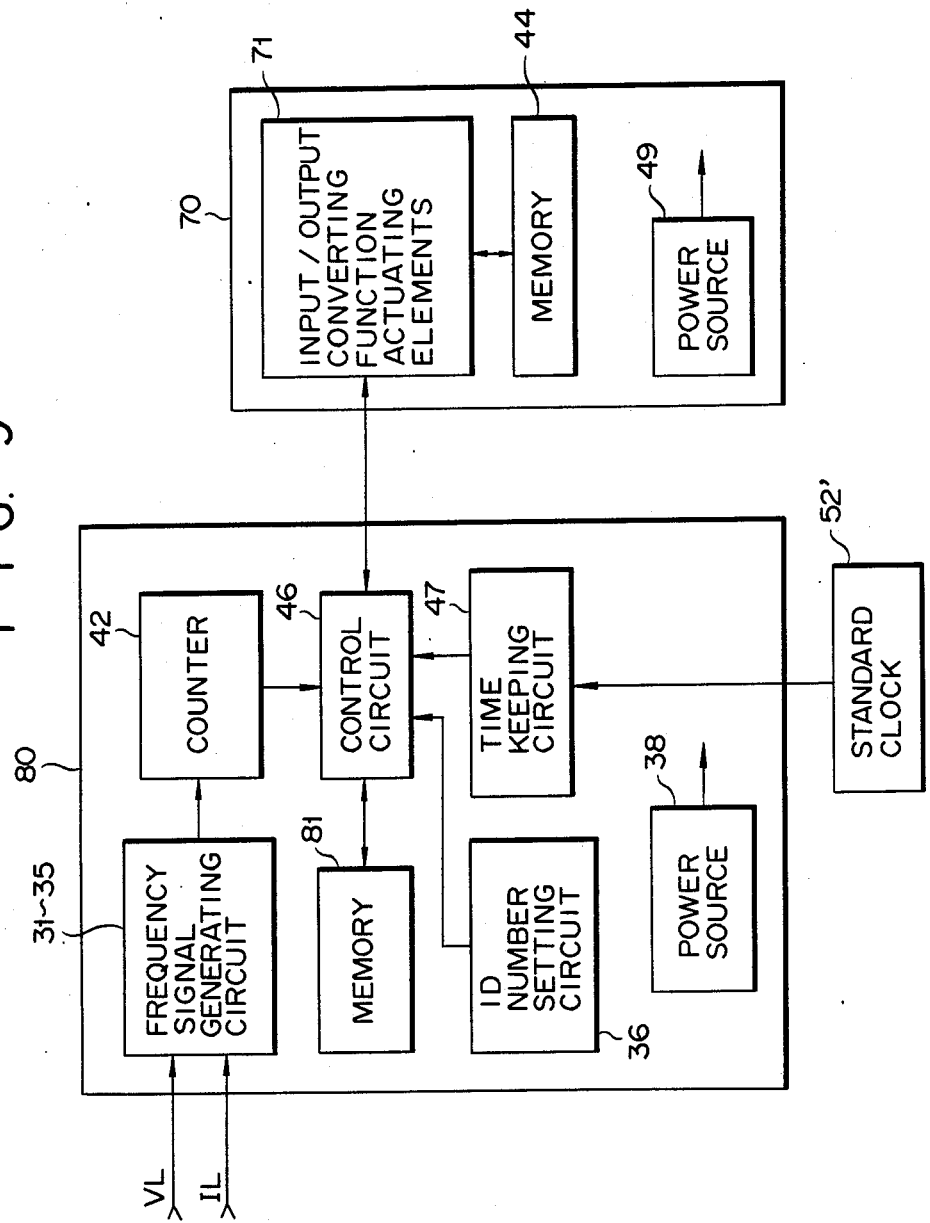

POWER LOAD SURVEY APPARATUS

BACKGROUND OF THE INVENTION

This invention relates to a power load survey apparatus comprising an electronic power sensor, a collector cartridge for data collection, and a memory/magnetic tape converting device.

Conventional power load survey apparatuses have generally comprised a power load survey meter 1 and a cassette recorder 20 as shown in FIGS. 1A and 1B.

The mentioned power load survey meter 1 operates to gauge a power load amount per limited time length and store the gauged amount in a memory, and to provide output data of the gauged amount with an ID number added to identify the instrument from which the load power was gauged. The mentioned cassette recorder 20 is normally not connected to the power load survey apparatus 1, but only when the mentioned output data is desired to be collected. After the cassette recorder 20 has collected the output data, the recorder is removed from the load survey apparatus 1 and connected to a separate magnetic cassette tape and magnetic tape converting device (not shown) where the data is transferred to a magnetic tape for computers. Thus, the output data on the magnetic tape can be tabulated and printed by a separately provided computer.

The conventional power load survey meter 1 has voltage and current converters 2 and 3 for converting an input load voltage VL and load current IL to signals proportional to the load voltage and the load current, respectively. Multiplier 4 multiplies the signals from both converters with each other. An integrator 5 including a W/F converter integrates the multiplication values. The integrated power value is frequency divided by a frequency divider 6, and the divided signals are counted by a counter 7. Memory 9 stores the count value therein in accordance with control of a control circuit 12. A timer circuit 8 for determining a time length and an ID number setting circuit 11 for setting a number identifying the instrument from which the input data are collected are provided. Outputs from both circuits are stored in the memory 9 under control of the control circuit 12. An output circuit 10 controls and outputs the data stored in memory 9 therefrom under control of the control circuit 9. An electric source 13 for the component circuits included in the power load survey meter 1 is formed from the mentioned load voltage VL.

The cassette recorder 20 includes an input circuit 21 for receiving the output data from the mentioned output circuit 10 when the recorder 20 is connected to the power load survey meter 1. A magnetic cassette tape device 22 records the signals received in the input circuit 21. The recording operation is performed under control of control circuit 23 which is in turn controlled by command from an operating section 24. Time data from the time keeping circuit 25 to indicate the time that the recording was made on the magnetic cassette tape device in terms of year, month, day, hour, minute and second. A setting time display section 26 sets the time of the time keeping circuit 25 and displays the time. The cassette recorder 20 has a power source 27 for supplying supply voltage to the component circuits.

The above outlined power load survey apparatus permits recognition of the instrument ID numbers, collected data and time of recording of the collected data on the basis of the data recorded in the magnetic cassette tape device 22 in the cassette recorder 20, thereby allowing the data to be analyzed in various ways by a computer per key-coded instrument ID number.

In use of the conventional power load survey apparatus, power load amounts are measured by power load survey meters 1 installed on the premises of individual consumers and collected from time to time by the mentioned cassette recorder. One or two cassette recorders 20 are sufficient to cover about 100 power load survey meters 1. Use of a magnetic cassette tape for storing data, however, has the following problems.

1. The operable temperature range of magnetic cassette tape is narrow so that use thereof is inhibited in cold or hot locations.

2. A portable cassette recorder 20 consumes much power requiring frequent replacement of the battery cells which are the power source.

3. Recording of data is performed with the magnetic cassette tape running, taking a long time.

4. The cassette recorder comprising the magnetic cassette tape device 22, battery cells 27 and control circuit 23 is heavy which makes it difficult to carry.

5. The time keeping circuit 25 contained in the cassette recorder 20 is subject to errors after a long period of use, which have to be rectified. The problem is worsened when the number of subscribers increases so that hundreds of cassette tape recorders have to be used. Operators then have to tune the individual time keeping circuits to a broadcasting time tone, making it difficult to tune all the time keeping circuits exactly.

In an attempt to overcome the enumerated problems and drawbacks, power load survey meters and cassette recorders have been integrated and only the magnetic cassette tape replaced. This prior art attempt solved the second, third and fourth problems, but could not solve the first and fifth ones, leaving the power load survey meters larger and more expensive.

SUMMARY OF THE INVENTION

The purpose of this invention is to provide a power load survey apparatus that can solve the above problems, is of lower weight, size and power consumption, and is able to turn the time keeping circuits in a plurality of cassette recorders to a common standard clock, thus enhancing the precision of the measurements.

A power load survey apparatus provided according to the invention to achieve the above stated object comprises electronic power sensor means for multiplying a proportional signal by a load voltage provided by converting an input load voltage by a proportional signal to a load current provided by converting an input load current, and converting the thus provided multiplication signal to a pulse signal of different frequencies which is then output as a load power amount; collector cartridge means detachably coupled to said electronic power sensor means for receiving said pulse signal indicative of a power load amount from said electronic power sensor means and having a self-contained memory for storing therein said received pulse signal and a time data generated from a self-contained time keeping circuit; and memory and magnetic tape converting means detachably coupled to said collector cartridge means and having a magnetic tape device for transferring thereto and recording therein data stored in said collector cartridge at least when said memory and magnetic tape converting device means are coupled to said collector cartridge means, and a standard clock for rectifying said time keeping circuit contained in said collector cartridge means.

The power load survey apparatus above has each component circuit of the collector cartridge formed as an electronic circuit, permitting high density and high integration for a miniaturized, overall light weight apparatus. Unlike the conventional collector cartridge, the collector cartridge according to the invention does not contain a magnetic cassette tape device, dispensing with the need for power for driving such a magnetic cassette tape device and decreasing the overall power consumption. The electronic components of the collector cartridge according to the invention have an operable temperature range wide enough to enable it to be used in cold or hot locations.

Collecting data from the electronic power sensor with the use of the survey apparatus according to the invention can be achieved by removing the collector cartridge which has a memory containing transferred data from the sensor, and coupling a new cartridge thereto. This replacement operation takes only a few seconds. When the removed collector cartridge is coupled to the memory and magnetic tape converting device for collection of the data for further processing, the time keeping circuit included in the cartridge, which may have a timing error, is rectified in accordance with the standard clock contained in the memory/magnetic tape converting device. This means that the time keeping circuit can be rectified each time that data is collected with the apparatus.

BRIEF DESCRIPTION OF THE DRAWINGS

FIGS. 2A, 2B and 2C are block circuit diagrams showing a power load survey apparatus embodied by the invention;

FIG. 6 shows a connection between the time keeping circuit in collector cartridge 47 and the standard clock in the memory/magnetic tape converting device 50 both shown in FIG. 2;

FIG. 8 is a block circuit diagram of a second modification of the collector cartridge of the invention; and FIG. 9 is a block circuit diagram of a modification of the electronic power sensor and collector cartridge according to the invention.

DETAILED DESCRIPTION OF THE PREFERRED EMBODIMENT

One embodiment of the invention will be described below with reference to FIGS. 2A, 2B and 2C.

Figure 1A:
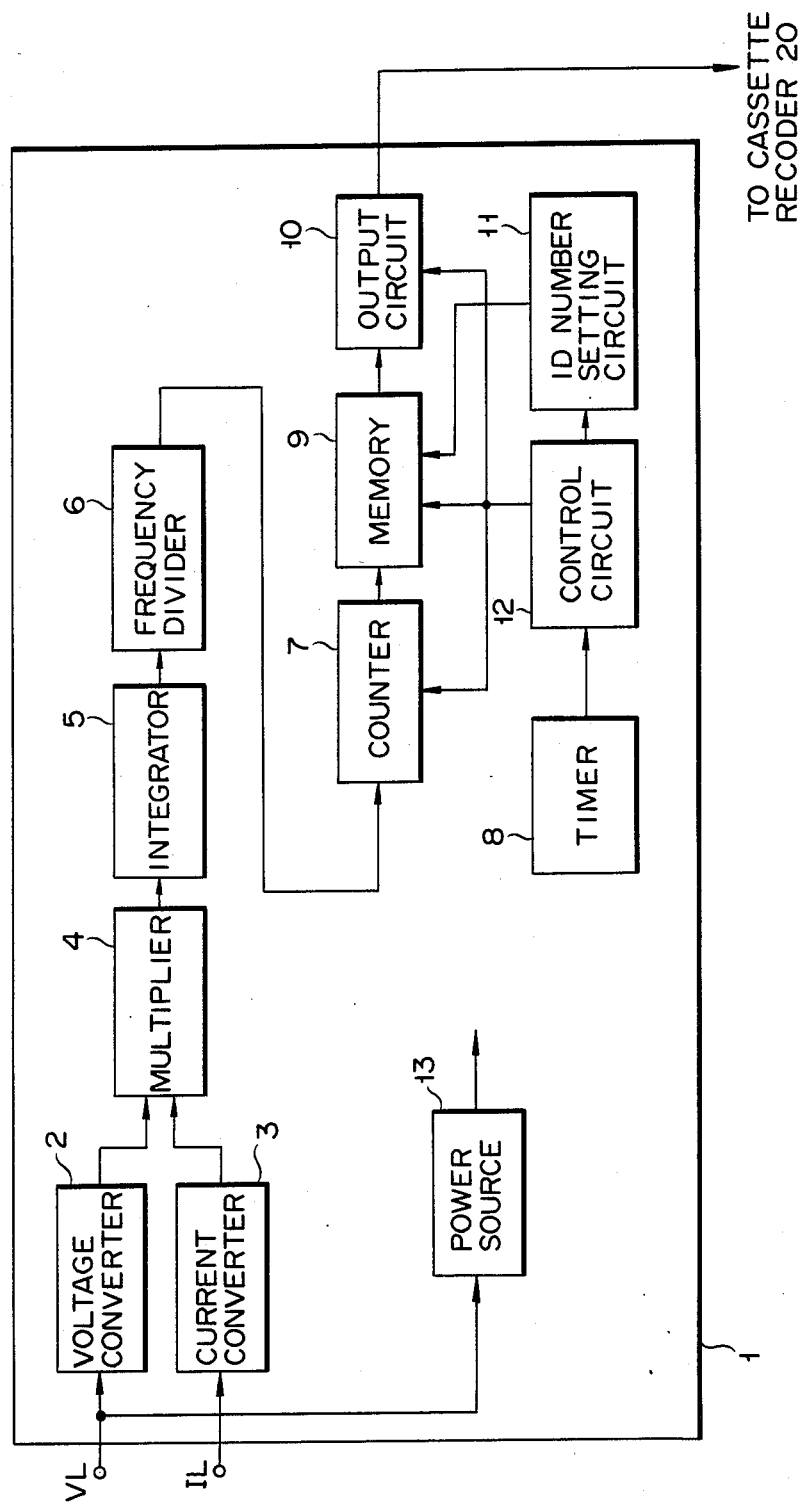
FIGS. 1A and 1B are block circuit diagrams showing a conventional power load survey apparatus.
Figure 1B:
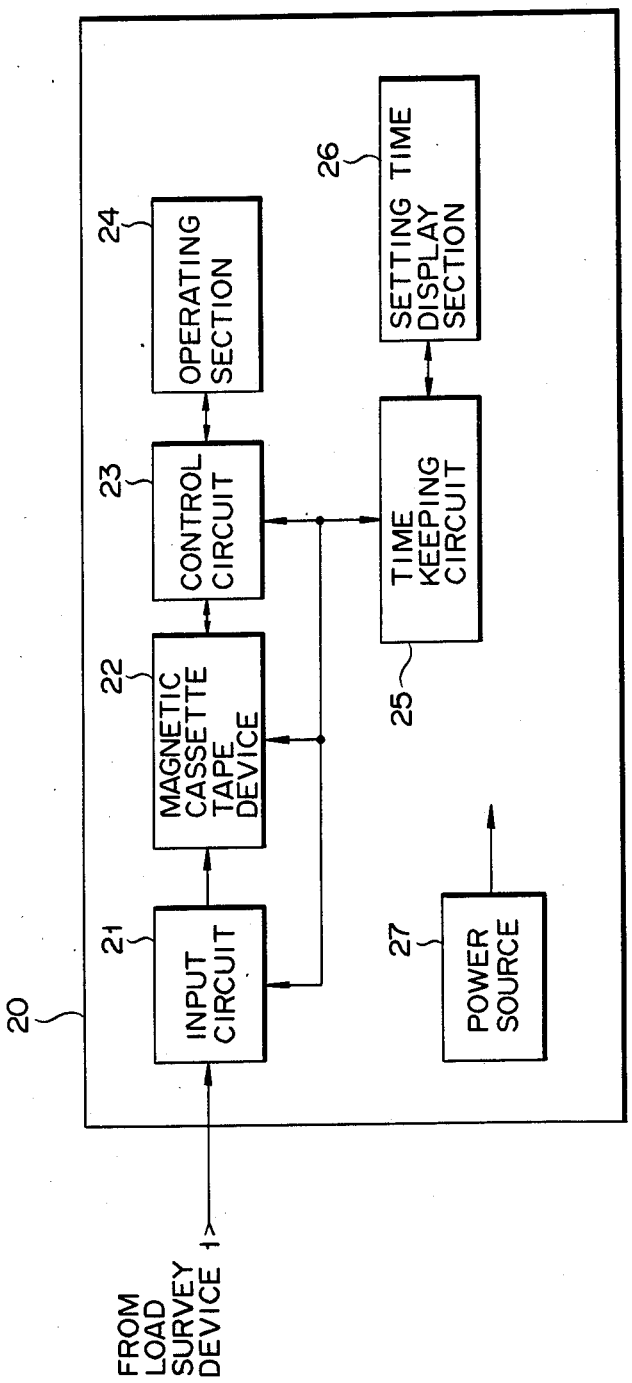
Figure 2A:
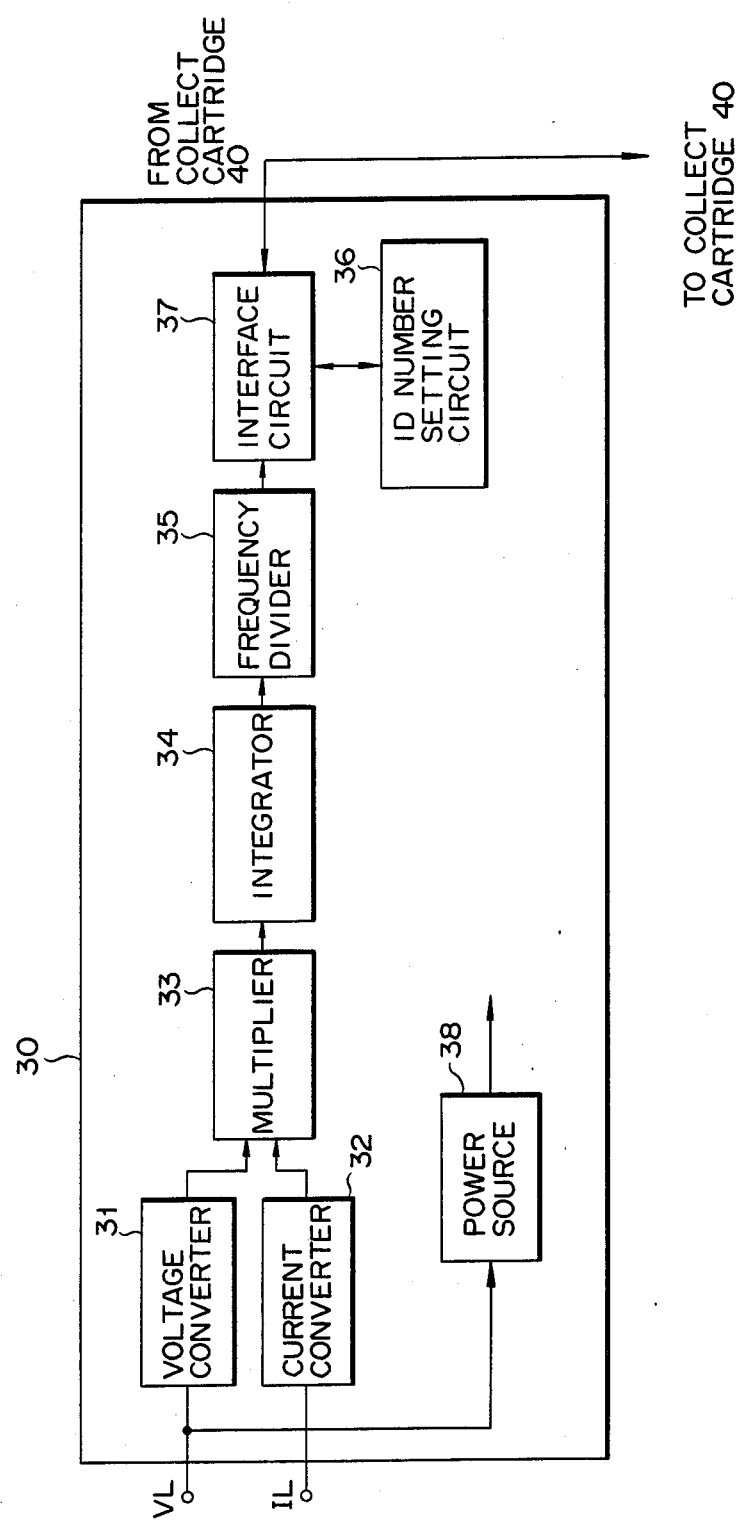

FIG. 2A shows an electronic power sensor 30 which comprises a voltage converter 31 for converting an input load voltage VL to a signal proportional to the load voltage; a current converter 32 for converting an input load current IL to a signal proportional to the load current; a multiplier 33 for multiplying both proportional signals; an integrator circuit 34 having, e.g., a W-F (width-to-frequency) converter, for converting a power value produced by the multiplier 33 to a pulse signal of different frequencies; a frequency divider circuit 35 for dividing the signal from the integrator 34; a circuit 36 for setting a number identifying an instrument on which the electronic power sensor is installed, hereafter called "ID number"; an interface circuit 37 for outputting a selected one of the output signals from the ID number setting circuit 36 or the frequency divider circuit 35; and a power source 38 for supplying supply voltages to the enumerated circuit components. The ID setting circuit 36 may be in a collector cartridge 40, rather than the electronic power sensor.

Figure 2B:
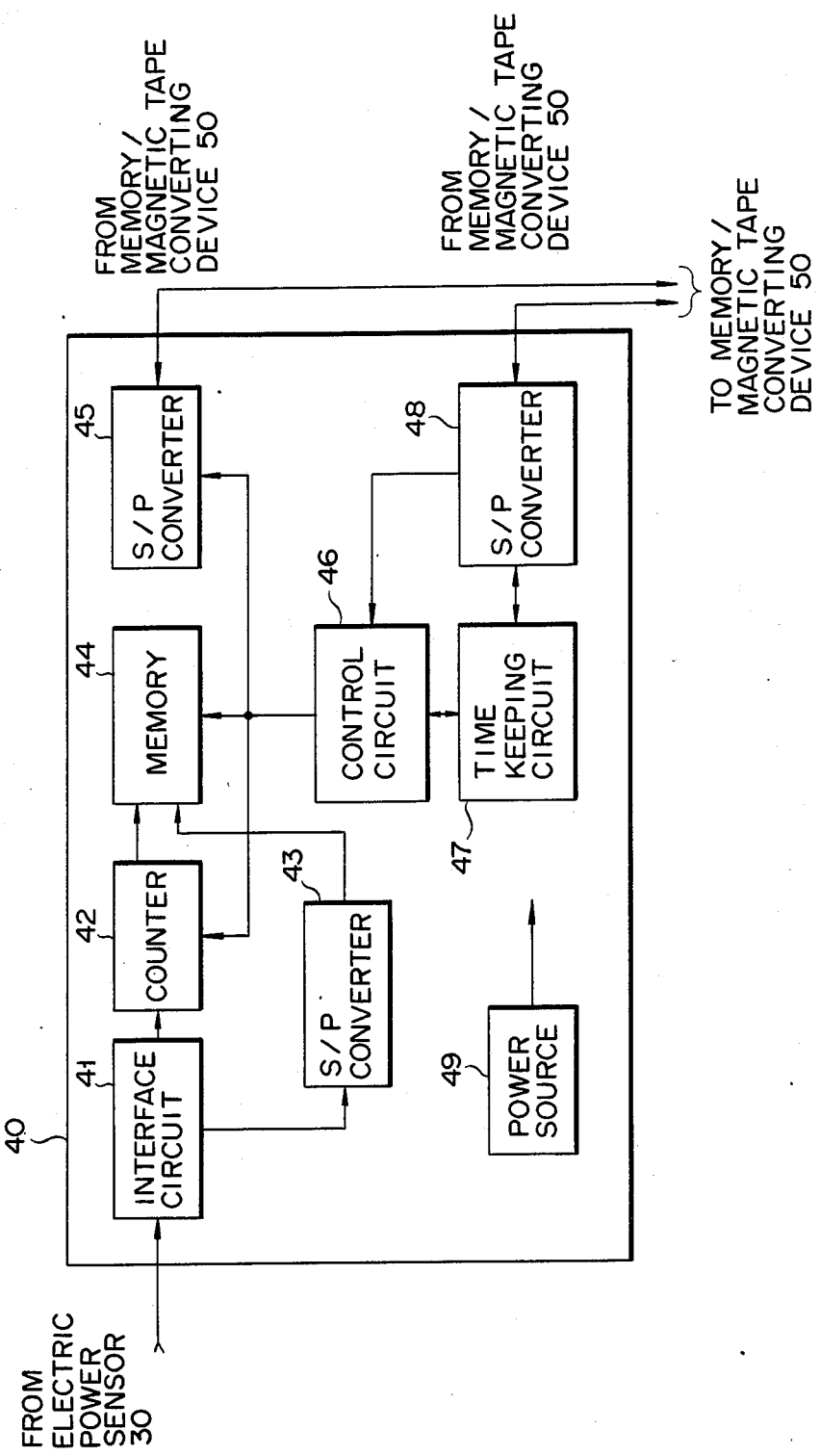

The collector cartridge 40 shown in FIG. 2B comprises an interface circuit 41 for receiving the output from the interface circuit 37 of electronic power sensor 30; a counter 42 for counting a pulse signal indicative of the power value produced through the interface circuit 41; an S/P converting circuit 43 for converting to the parallel form the serial output signal from the ID number setting circuit 36 through the interface circuits 37 and 41; a control circuit 46; memory 44 for storing therein the output from the counter 42 and the parallelized ID number at a determined time limit under the control of the control circuit 46; an S/P converting circuit 45 for converting the parallel signals from the memory 44 to the serial form and transmitting the serial signals to a memory/magnetic tape converting device 50 hereafter described; a time keeping circuit 47 connected to memory 44 through the control circuit 46 for producing data of year, month, day, hour, and minute and a timing for writing into the memory; an S/P converting circuit 48 for receiving and converting to the parallel form a serial time rectifying signal from a standard clock contained in the memory/magnetic tape converting device 50 described below, said S/P converting circuit being connected to the time keeping circuit 47 and the control circuit 46; and a power source 49 for supplying a supply voltage to each above-mentioned circuit component.

Figure 3:
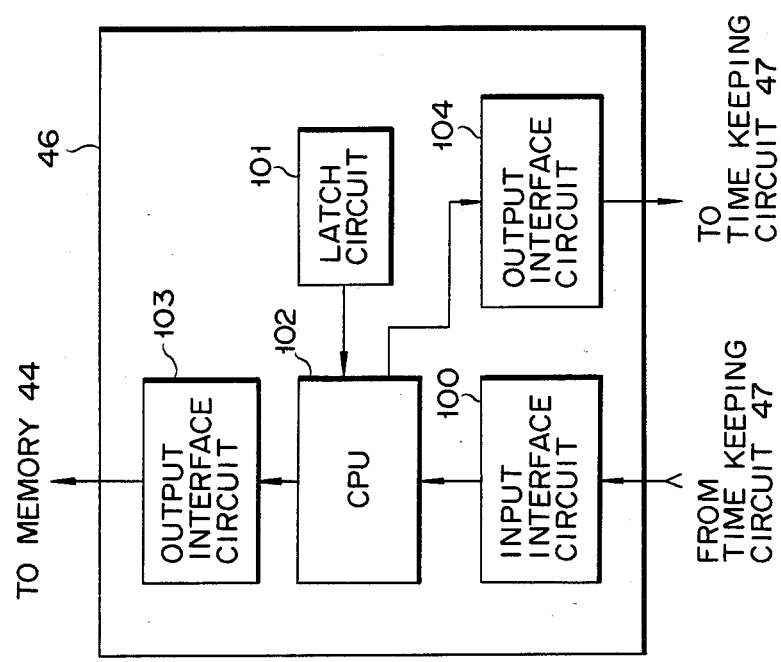
FIG. 3 is a block circuit diagram showing an example of the control circuit 46 shown in FIG. 2B.

An exemplary detail circuit construction of the control circuit 46 is shown in FIG. 3. It consists has an interface 100 for inputting a timing signal from the time keeping circuit 47; a latch circuit 101 for receiving and latching the parallel signal derived from the S/P converting circuit 48; a CPU, or 8-bit CPU such as INTEL 8049, for receiving and processing the outputs from the input interface 100 and the latch circuit 101; output interface 103 for transmitting the outputs from the CPU 102 to the above-mentioned memory 44; and another output interface for transmitting the outputs from the CPU 102 to the above-mentioned time keeping circuit 47. The latch circuit 101 and the other output interface 104 can function as a time rectifying circuit when the above-mentioned S/P converting circuit 48 receives a command signal for time rectification.

The mentioned memory/magnetic tape converting device 50 is shown in FIG. 2C and is located in a separately provided center apparatus. It comprises an I/O interface circuit 51 for inputting the data stored in the memory 44 of the above stated collector cartridge 40 through the above-mentioned S/P converting circuit 45; a high-precision standard clock 52 including a crystal oscillator; a time setting section 53 connected to the standard clock 52 and through the S/P converting circuit 48 of collector cartridge 40 to the time keeping circuit therein for rectifying the time data from the latter circuit to the standard time of clock 52; and a magnetic tape device 54 connected to the I/O interface circuit 51 and to the time setting section 53 for recording on a magnetic tape ID number data and the power measurement data from collector cartridge 40 through a control circuit 55, e.g., a known 16-bit microcomputer; and the measuring time provided by the above-mentioned time setting circuit 53. A power source 56 is included therein for supplying a voltage to each circuit component thereof.

Operation of the power load survey apparatus comprising an electronic power sensor 30, collector cartridge 40 and memory/magnetic tape converting device 50 according to the invention will be now described. Load voltage VL and current IL are converted by voltage and current converters 31 and 32 to voltage and current proportional signals which are then multiplied by multiplier 33. A power amount indicating signal thus produced by multiplier 33 is integrated by integrator 34 so that the same is converted to pulse-shaped frequency signals proportional to the measured power amount. The frequency signals provided by the integrator 34 are frequency divided by frequency divider 35 and are then output through interface circuit 37 along with an ID number from the ID number setting circuit 36.

Figure 4:
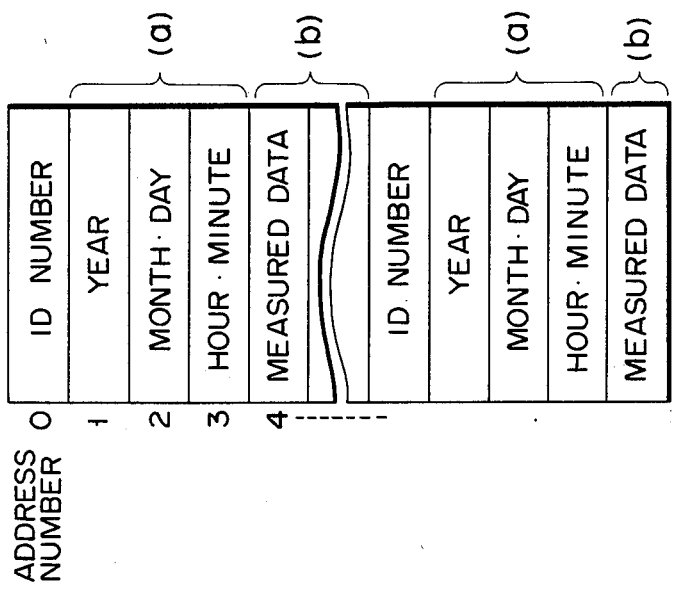
FIG. 4 shows one example of the format stored in the memory 44 shown in FIG. 2B.

When a data collector carrying a collector cartridge of the invention with couples the collector cartridge 40 to electronic power sensor 30, the output data from the interface circuit 37 are received by interface circuit 41 in the coupled collector cartridge 40. The power amount indicating measurement signal thus received by the interface circuit 41 is counted by counter 42, and the ID number thus received is converted by S/P converting circuit 43 to the parallel form. After that, both are stored in memory 44. Memory 44 can store the collection time of the measured data at a determined timing, the collection time being derived from the time keeping circuit 47. Memory 44 may store the data in the format shown in FIG. 4 wherein daily measured data at the starting time of measurement are stored in lines (a), and those measured every fifteen minutes the same day in lines (b) for each individual instrument designated by an ID, thus permitting daily data to be collected.

Figure 5:
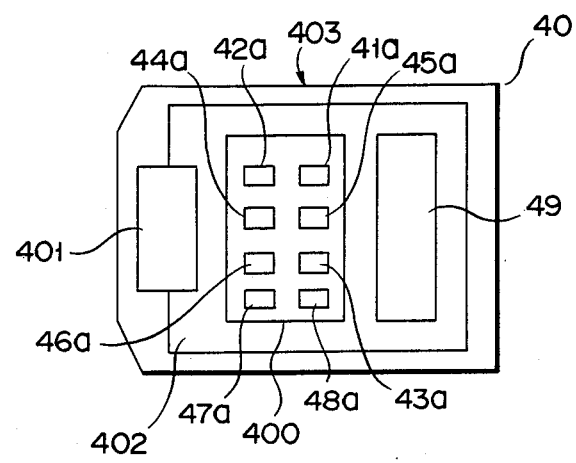
FIG. 5 shows an IC chip structure of the collector cartridge shown in FIG. 2.

The circuits of collector cartridge 40 are all integrated in one package for miniaturization and reducing of power consumption. Referring to FIG. 5, counter IC chip 42a, time keeping circuit IC chip 47a, interface circuit IC chip 41a, S/P converting circuit IC chip 43a, 45a and 48a are all packaged in a high density, hybrid function circuit module 400. To this module 400, connectors 401, cells 49 and any other components are connected on a separate substrate 402, which is accommodated in a casing 403.

The collector cartridge 40 is removed from electronic power sensor 30, and later coupled to memory/magnetic tape converting device 50. The measurement data stored in memory 44 is then recorded through S/P converting circuit 45 and I/O interface circuit 51 to magnetic tape device 54 under control of control circuit 55. After the measurement data have been recorded in magnetic tape device 54, control circuit 55 applies a clear signal to memory 44 to clear the stored memory, thereby enabling reuse of the memory. The power values measured at electronic power sensor 30, after having been collected by collector cartridge 40, can thereby be recorded on a magnetic tape in the memory/magnetic tape converting device 50 installed in the center apparatus.

A connector is used to detachably couple collector cartridge 40 and memory/magnetic tape converting device 50. To simplify the coupling operation, S/P converting circuits 45 and 48 are provided in collector cartridge 40 so that signals are treated in the serial and parallel forms inside and outside of the collector cartridge and memory/magnetic tape converting device to reduce the number of connection pins therebetween.

As is apparent in the foregoing, the electronic power sensor 30 is permanently operative to measure power amounts and at a determined cycle outputs a pulse signal proportional to a power amount divided by the frequency divider. A collection gap of measured data for 2 or 3 minutes may occur after collector cartridge 40 is removed for replacement of a new collector cartridge, which is of little importance.

The time rectifying operation will be described.

Time keeping circuit 47 in the collector cartridge 40 is permanently operative on the voltage supply from power source 49, and may have a timing error after long use so that incorrect timing data are stored in memory 44, failing to provide correct timing measurement data. This drawback itself can be avoided by use of a high precision time keeper but this makes the collector cartridge too expensive. In the power load survey apparatus according to the invention, after collector cartridge 40 which is collected and coupled to memory/magnetic tape converting device 50, has recorded measurement data in memory 44 in magnetic tape recorder 50, thereby clearing the storage contents from memory 44, a clear completion signal is received from control circuit 55. The above-mentioned time setting circuit 53 then operates to apply the standard time of standard clock 52 to time keeping circuit 47 in collector cartridge 40 for performing time rectification.

FIG. 6 shows circuit structures of, and connections between, time keeping circuit 47 in collector cartridge 40 and standard clock 52 in memory and magnetic tape converting device 50. FIG. 6 is referred to in the course of the following description of the time rectifying operation.

Time keeping circuit 47 comprises a crystal oscillator 47a, a frequency divider 47b for dividing oscillation pulses from the crystal oscillator to generate one second pulses, counter means 47c having second, minute hour, day, month and year counters counting the one second pulses from the frequency divide, an I/O control section 47d connected to the counters for inputting and outputting count value data for rectifying the count values of the respective counters, and a gate switching section 47e for switch controlling a desired gate in the I/O control section 47d. Year, month, day, hour, minute and second counting outputs from each counter in the counter means 47c are separately read out and written in the above-mentioned memory 44 from which they can be read out.

Standard clock 52 in the memory/magnetic tape converting device 50 comprises a crystal oscillator 52a, a frequency divider 52b for dividing oscillation pulses from the crystal oscillator to generate one second pulses, counter means 52c having second, minute, hour, day, month and year counters counting the one second pulses from the frequency divider, and an I/O control section 52d connected to the counters for controlling input and output of count values of the individual counters. When collector cartridge 40 is mounted in memory/magnetic tape converting device 50, the count outputs from the counter means 52c are supplied through I/O control section 52d and inputted through S/P converting circuit 48 and I/O control section 47d in this order into the counter 47c, so that the time counted by the latter is rectified to the standard time indicated in the counter means 52c of the standard clock 52. Any of the counters in the counters 47c can be selected as desired to be time rectified. Specifically, if the item to be rectified is, for example, the count value of the year counter, the time setting section 53 generates a year designating signal under control of control circuit 55, the year designating signal being supplied through S/P converting circuit 48 to the gate switching section 47e which will generate a gate switching signal controlling the corresponding gate in I/O control section 47d to the year counter. The count value in the year counter in counter means 52c of standard clock 52 is then read out therefrom through the time setting section 53 under control of control circuit 55, and supplied through S/P converting circuit 48 and I/O control section 47d in this order for rectifying the count value of the year counter in counter means 47c to the count value of the standard clock. Any other counters, month, day, hour, minute, and second counters can be rectified in a similar manner to the count values of the standard clock.

As is obvious in the foregoing description, detection of the time difference is not made before time rectification operation, whereby the count values of the individual one of the year, month, day, hour, minute and second counters in the time keeping circuit 47 of collector cartridge 40 are compared to the corresponding standard time indicated in the standard clock. Rather, count values in the time keeping counters are replaced with the time data in the standard clock, whether the contents of the time keeping counters are erroneous or not. After the data have been replaced, whether the replaced data are correct is checked. To perform this checking operation, the time setting section 53 generates a designating signal of the rectification item under control of control circuit 55 to cause the gate switching section 47e to control the switching of gates of I/O control section 47d, allowing the rectified count value data to be read out from the determined counter of counter means 47c. The read count value data are compared in control circuit 55 to the corresponding standard count value of the counter means 52c of the standard clock 52 for determining whether the correct value is written in the time keeping circuit. This finishes the time rectification operation. Thus, thousands of collected collector cartridges 40 can all be time rectified to the standard time of one common standard clock contained therein simply by coupling to one memory/magnetic tape converting device installed in the center apparatus.

Figure 7:
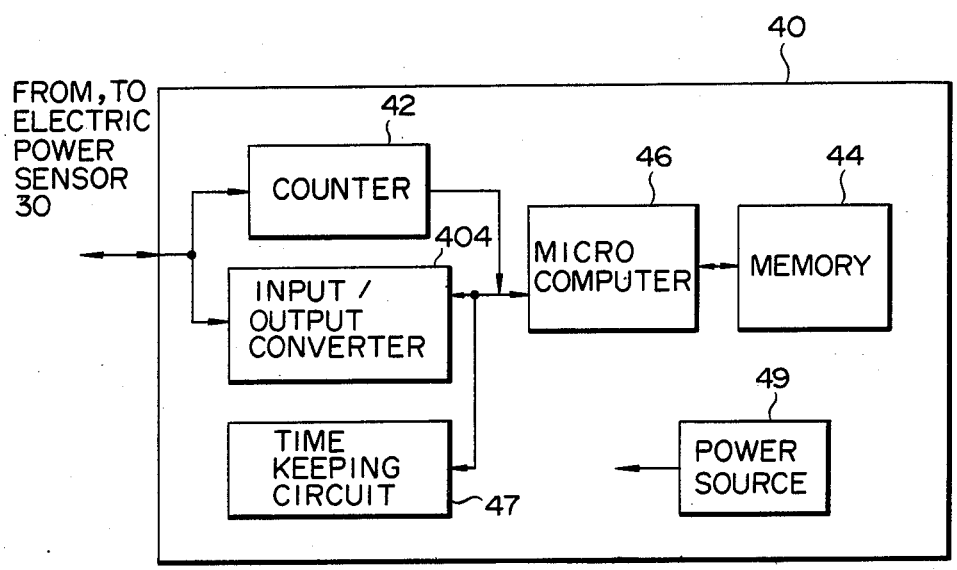
FIG. 7 is a block circuit diagram of a modification of the collector cartridge of the invention.

Reference will now be made to FIG. 7 showing a modification of the collector cartridge 40. The shown modification is identical to the collector cartridge of FIG. 3, except it includes a custom IC I/O converting circuit 404 functioning as interface circuit 41 and S/P converting circuits 43, 45 and 48 of FIG. 3, and C-MOS one chip microcomputer as control circuit 46 of the same FIG. 7. The modification has a control function permitted by a program written in the mask ROM which can be changed to change the control function.

FIG. 8 shows a second modification of the first one shown in FIG. 7. In the second modification, memory 44 and power source 49 are separated from the rest of collector cartridge 40-1 to form a memory pack 40-2 which can be incorporated in a memory recorder transportable by the data collecting personnel. To make measurements of power amounts of many consumers, the data collecting personnel carries one such memory recorder and collects data from many consumers by replacing the memory packs 40-2 depending on the amount of data to be collected.

FIG. 9 shows another embodiment where electronic power sensor 30 and collector cartridge 40 are combined in a different way to form a memory pack 70 and a power sensor 80. The memory pack 70 comprises in one casing I/O converting function actuating elements 71, memory 44 and cell power source 49. The power sensor 80 includes a frequency signal generating circuit 31-35 for integrating inputted voltage and current or a power amount to be gauged to a pulse shaped frequency signal, a counter 42 for counting the frequency signal, memory 81 for therein storing the count value of the counter 42 under control of the control circuit 46, ID number setting circuit 36, time keeping circuit 47 and power source circuit 38. The measured data are transferred from memory 81 to the memory 44 in memory pack 70 upon collection of data. In this modification, a separate standard clock or item corrector 52' is connected thereto for time rectifying the time keeping circuit 47 contained in the power sensor 80.

What is claimed is:

1. A power load survey apparatus comprising:
   electronic power sensing means for multiplying a signal proportional to a load voltage by a signal proportional to a load current, and producing a multiplication signal indicative thereof and for converting said multiplication signal to a pulse signal which is then outputted as a power load amount;
   collector cartridge means, detachably coupled to said electronic power sensing means, for receiving said pulse signal from said electronic power sensing means when said collector cartridge means is coupled thereto, said collector cartridge means having: (a) a counter having an ID number setting circuit for outputting an ID number signal and for counting said pulse signals indicative of said power load amount when said collector cartridge means is coupled to said electronic power sensing means to produce an output signal indicative thereof, (b) memory means, coupled to said counter for storing said output from said counter, (c) a time keeping circuit coupled to said memory means for causing time data to be stored in said memory means at intervals of a determined length, and (d) power source means for supplying a supply voltage to said collector cartridge means, said collector cartridge means being an interchangeable unit; and
   memory and magnetic tape converting means, detachably coupled to said collector cartridge means, and including (a) a magnetic tape device for transferring thereto and recording therein data stored in said collector cartridge means when said memory and magnetic tape converting means is coupled to said collector cartridge means, (b) a standard clock keeping a standard time, and (c) time rectification means for applying said standard time of said standard clock to said time keeping circuit of said collector cartridge means when said memory and magnetic tape means is coupled to said collector cartridge means to thereby cause said time keeping circuit to be time rectified to said standard time;
   wherein said collector cartridge means further includes (e) converting means for coupling to said memory and magnetic tape converting means to receive said time data from said standard clock and for applying said time data to said time keeping circuit.

2. The power load survey apparatus according to claim 1 wherein said ID number setting circuit produces a serial ID number signal and said collector cartridge means further includes: (a) a S/P converting circuit means for converting said serial ID number signal to a parallel signal, (b) another S/P converting circuit operative when coupled to said memory and magnetic tape converting means to receive a serial time data from said standard clock and to convert said serial time data to a parallel signal for application to said time keeping circuit, and wherein said memory means is also for storing said outputs from said S/P converting circuit.

3. The power load survey apparatus according to claim 2 wherein said collector cartridge has at least parts of said counter, said S/P converting circuit, said memory, said time keeping circuit and said other S/P converting circuit formed as a hybrid functional circuit module.

4. The power load survey apparatus according to claim 2 wherein said collector cartridge is comprised of a body including at least a memory for storing therein collected measured data, a memory pack portion having a separate memory from said first memory and a battery source.

5. The power load survey apparatus according to claim 2 wherein said collector cartridge is comprised of a body including at least a memory for storing therein collected measured data, and a memory pack portion having input/output converting function actuating elements, a separate memory from said first memory and a battery source.

* * * * *